United States Patent [19]

Ai et al.

[11] Patent Number: 4,702,997
[45] Date of Patent: Oct. 27, 1987

[54] PHOTOPOLYMERIZABLE LAMINATE

[75] Inventors: Hideo Ai; Akihiko Ideda; Jiro Sato, all of Fuji, Japan

[73] Assignee: Asahi Kasei Kogyo Kabushiki Kaisha, Osaka, Japan

[21] Appl. No.: 826,712

[22] Filed: Feb. 6, 1986

Related U.S. Application Data

[63] Continuation of Ser. No. 604,809, Apr. 27, 1984, abandoned.

[30] Foreign Application Priority Data

May 9, 1983 [JP] Japan .................................. 58-80445

[51] Int. Cl.$^4$ ......................... G03C 5/16; G03C 1/70
[52] U.S. Cl. .................................... 430/325; 430/284; 522/95
[58] Field of Search .................... 430/284, 325; 522/95

[56] References Cited

U.S. PATENT DOCUMENTS

| | | | |
|---|---|---|---|
| 4,019,972 | 4/1977 | Faust | 430/283 |
| 4,088,498 | 5/1978 | Faust | 522/87 X |
| 4,296,196 | 10/1981 | Faust | 430/284 X |
| 4,438,190 | 3/1984 | Ishimaru et al. | 430/284 X |
| 4,499,163 | 2/1985 | Ishimaru et al. | 430/325 X |

FOREIGN PATENT DOCUMENTS 1379228  1/1975  United Kingdom.

Primary Examiner—John E. Kittle
Assistant Examiner—Cynthia Hamilton
Attorney, Agent, or Firm—Sprung Horn Kramer & Woods

[57] ABSTRACT

A photopolymerizable laminate comprising a photopolymerizable layer and a support layer, said photopolymerizable layer containing;

(1) 5 to 95% by weight, based on the total weight of the photopolymerizable layer, of a binder comprising a vinyl polymer or a vinyl copolymer, (2) 95 to 5% by weight, based on the total weight of the photopolymerizable layer, of a monomeric component containing at least 50% by weight of at least one compound selected from the group consisting of the photopolymerizable unsaturated compounds represented by the formulae (A), (B) and (C) shown below and having a value of molecular weight/number of double bonds contained of 1000 or less, and (3) 0.01 to 30% by weight, based on the total weight of the photopolymerizable layer, of a photopolymerization initiator.

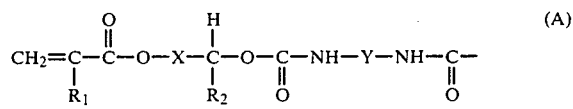

(A)

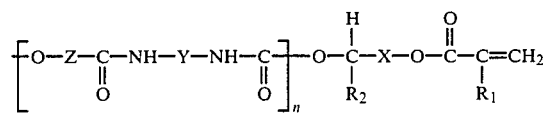

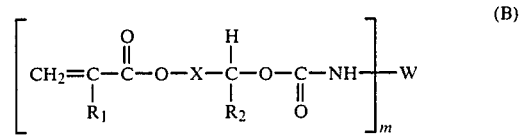

(B)

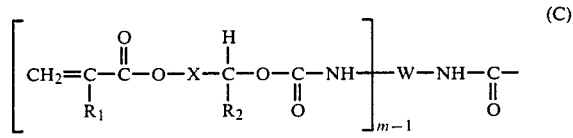

(C)

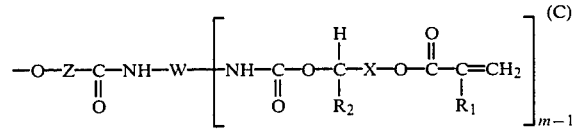

3 Claims, No Drawings

PHOTOPOLYMERIZABLE LAMINATE

This is a continuation of application Ser. No. 604,805, filed Apr. 27, 1984, now abandoned.

BACKGROUND OF THE INVENTION

1. Field of the Invention

This invention relates to a novel photopolymerizable laminate. More particularly, the present invention pertains to a photopolymerizable laminate which is useful for preparation of a printed circuit board.

2. Description of the Prior Art

As photoresist materials for preparation of printed circuit boards, photopolymerizable elements, so-called dry film resists, which comprise a photopolymerizable layer and a support layer have been known. The dry film resists are usually prepared by laminating a photopolymerizable material on a flexible support film, and optionally covering the surface of the photopolymerizable material with a protective film. When preparing a printed circuit board by use of the dry film resist (hereinafter referred to as "DFR"), first after peel-off of the protective layer, the photopolymerizable layer is laminated on a substrate for forming permanent images, for example, a copper-clad laminate and then subjected to imagewise exposure, followed by peel-off of the support layer, if desired. Subsequently, by using a developing liquid, the support layer left ro remain as desired and the unexposed portion of the photopolymerizable layer are removed by dissolution of dispersion to form a resist image on the surface of the substrate. Then, a desired printed circuit board can be obtained by two ways. One way consists of etching the portion of the substrate where the resist is not formed and stripping the resist. The other way consists of plating the portion of the substrate where the resist is not formed, stripping the resist, and etching the substrate where the resist has been stripped.

Whereas, recently, among the printed circuit boards prepared by use of DFR, increased is the printed circuit boards with electrical connection between one surface and the other surface of the boards through an electroconductive circuit-forming material layer, for example, a thin copper layer, provided on the inner surfaces of thru-holes. As the method for preparation of printed circuit of this kind, the copper thru-hole methods and the solder thru-hole methods are generally known, and the tenting method is becoming popular among the copper thru-hole methods. In the tenting method, simultaneously with formation of wiring images by exposure, both openings of the thru-hole are completely sealed with the photo-hardened layer. During etching of the copper thin layer, etc., in order to form a wiring, said photohardened layer protects the electroconductive layer on the inner surface of the thru-hole against etching solution and therefore it is possible to obtain a printed circuit in which the both surface are conductive to each other through the thru-hole. The electroconductive circuit-forming material layer on the peripheral surface of the openings of the thru-hole may have a width which is very limited due to the restriction in circuit designing. Accordingly, in the above-mentioned tenting method, the photopolymerized layer sealing the openings on both sides of the thru-hole is supported on a band portion with a very narrow width which is called land. The exposed photopolymerized layer sealing the openings will be showered with developing solution and etching solution and therefore may frequently suffer from breaking of the photopolymerized layer or peeling off from the substrate. For this reason, the photopolymerizable layer to be used for the tenting method is required to have good mechanical strength, good adhesiveness to the substrate and chemical resistance after exposure.

In this context, the photopolymerizable layer of DFR widely used at present time comprises (1) an unsaturated compound having at least one ethylenic group capable of photopolymerization as a monomer, (2) a thermoplastic organic polymer as a binder, (3) a photopolymerization initiator and (4) other additives (see U.S. Pat. Nos. 3,622,334 and 4,320,189).

The above-mentioned monomer may include trimethylolpropane triacrylate and pentaerythritol triacrylate having two or more ethylenic double bonds. As another example, there is also shown triethyleneglycol diacrylate having ether linkage. On the other hand, as the binder, those compatible with monomer are chosen, as exemplified by polymethyl methacrylate, copolymers of methacrylic acid ester, acrylic acid ester or styrene.

However, the mechanical strength or the adhesiveness with a substrate of the photopolymerized layer is influenced by the monomer, the binder and their ratios employed, particularly greatly by the monomer. The mechanical strength, chemical resistance and adhesiveness with the substrate of the photopolymerizable layer employing the monomer as mentioned above are not necessarily satisfactory, when the photopolymerizable layer is thin. Accordingly, when using the tenting method, the photopolymerizable layer must be made thick.

On the other hand, demand for miniaturization of electronic parts and elements is increasingly strong, and correspondingly the printed circuit board with higher density or finer lines is strongly desired.

For formation of such a high density printed circuit, the DFR employed must have a high resolution, but the resolution is lowered by increasing the thickness of the photopolymerizable layer. Accordingly, when image formation is effected by applying the DFR comprising the photopolymerizable layer as described above for the tenting method, it is difficult to obtain a circuit image which is very precise and of high density.

On the other hand, according to the solder thru-hole method widely used also at the present time, the electroconductive circuit-constituting material layer, for example, copper thin layer, is covered with a protective metal such as solder before etching of the unnecessary portions on the surface of the substrate for forming permanent images. In the solder thru-hole method, the substrate covered with a patterned photopolymerized layer is subjected to cleaning for copper plating such as defatting by alkali washing, defatting by washing with an aqueous surfactant solution or electrolytic polishing, and then to electroless copper plating and further to copper plating and solder plating. Accordingly, also in the case of preparing a high density printed circuit, a line distance of the circuit will become narrower.

Thus, when the line distance becomes narrower, penetration of a plating solution or a cleaning solution into the resist or between the resist and the substrate and small float of the resist during cleaning before plating, copper plating and solder plating treatment pose great problems, and therefore DFR is required to have excellent resistance to cleaning reagents, copper plating and solder plating. The copper plating resistance, solder plating resistance and resistance to cleaning reagents of the photopolymerized layer are also influenced by the monomer and the binder employed for the photopolymerizable layer, particularly predominantly by the monomer and its amount. The photopolymerizable layer using as the monomer an acrylic acid ester or a methacrylic acid ester having only an ester bond or an ester bond and an ether bond such as trimethylolpropane triacrylate or polyethylene glycol diacrylate is insufficient particularly in copper plating resistance, solder plating resistance and resistance to pre-treatment chemicals.

In order to compensate for such drawbacks, for example, it has been proposed to add a heterocyclic compound to the photopolymerizable layer (see U.S. Pat. No. 3,622,334 and Japanese Laid-open Patent Publication No. 192946/1982). However, such composition has a disadvantage that the additive may sometimes be precipitated during storage of DFR for a long term.

G.B. Pat. No. 1379228 discloses a photopolymerizable copying material using a monomer represented by the formula (A') shown below:

$$R_2''-\underset{\underset{R_3''}{|}}{\overset{\overset{R_1''}{|}}{C}}-CH_2-(O-CH_2-CH_2)_{n1}-O-CO-NH-X'-NH-CO-O-(CH_2-CH_2-O)_{m1}-CH_2-\underset{\underset{R_3'}{|}}{\overset{\overset{R_1'}{|}}{C}}-R_2' \quad (A')$$

wherein

X' is a saturated hydrocarbon radical with 2 to 12 carbon atoms or an arylene radical with 6 to 10 carbon atoms, $R_1''$ and $R_1'$, which are identical or different, are each alkyl with 1 to 3 carbon atoms, $R_4'$ or $CH_2R_4'$, $R_2''$, $R_2'$, $R_3''$ and $R_3'$ are identical or different and are each H, $CH_3$ or $CH_2R_4'$, $R_4'$ is $O-CO-CR_5'{}_5Z=CH_2$, $R_5'$ is H or $CH_3$, and $n_1$ and $m_1$ are identical or different numbers from 0 to 20, $R_4'$ being present in at least one of the radicals $R_1''$, $R_2''$ and $R_3''$ and in at least one of the radicals $R_1'$, $R_2'$ and $R_3'$.

However, the monomer represented by the formula (A') is small in solubility in a conventional developer for manufacturing of printed circuit boards using DFR, such as 1,1,1-trifluoroethane, trichloroethylene, etc. This means that minute amount of monomer will remain on the substrate, even when attempted to remove the unexposed portion by developing, which poses the problem that subsequent steps of plating, etching, etc. will not proceed uniformly.

As the improved method for preparation of a printed circuit board using DFR, it has been proposed to use a photopolymerizable laminate whose support layer can be dissolved or dispersed in a liquid for developing of the photopolymerizable layer and, after exposure for image formation, to remove by developing the flexible support layer and the unexposed portion of the photopolymerizable layer as such, without peeling off the flexible support layer from the photopolymerizable layer, thereby forming a resist image on a substrate for forming permanent images (U.S. Pat. Nos. 4,211,560, 4,301,230 and 4,360,582). This method has the advantage of simplifying the steps in preparation of printed circuit boards.

However, in the case when using as the monomer in the photopolymerizable layer in this method, for example, an acrylic acid ester or a methacrylic acid ester having only an ester bond or an ester bond and an ether bond such as trimethylolpropane triacrylate or polyethylene glycol diacrylate, if lamination is performed at a high temperature while applying an excessive tension on DFR, there may be generated cracks on the flexible support layer laminated on the substrate for forming permanent images.

SUMMARY OF THE INVENTION

The principal object of this invention is to provide a photopolymerizable laminate which results in images having good mechanical strength and excellent plating resistance after exposure.

Other objects and advantages of the present invention will become apparent from the following description.

The laminate disclosed in the present invention comprises a photopolymerizable laminate comprising a photopolymerizable layer and a support layer, optionally with a protective layer existing on the surface of the photopolymerizable layer, said photopolymerizable layer containing:

(1) 5 to 95% by weight, based on the total weight of the photopolymerizable layer, of a binder comprising a vinyl polymer or a vinyl copolymer, (2) 95 to 5% by weight, based on the total weight of the photopolymerizable layer, of a monomeric component containing at least 50% by weight of at least one compound selected from the group consisting of the photopolymerizable unsaturated compounds represented by the formulae (A), (B) and (C) shown below and having a value of molecular weight/number of double bonds contained of 1000 or less, and (3) 0.01 to 30% by weight, based on the total weight of the photopolymerizable layer, of a photopolymerization initiator,

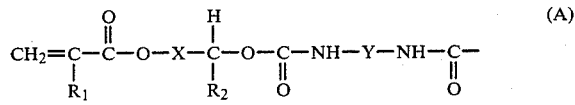

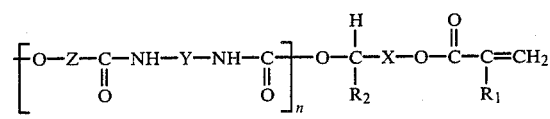

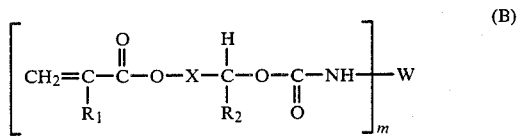

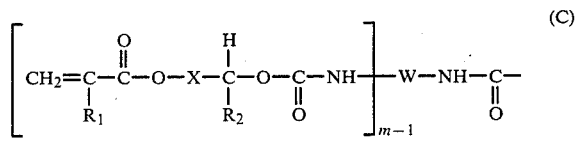

-continued

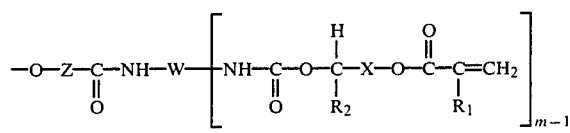

wherein
n is an integer of 0 or more;
m is an integer of 3 to 10;
$R_1$ is hydrogen or methyl;
X is a divalent $C_{1-8}$ aliphatic hydrocarbon group,

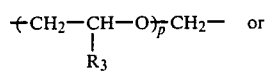

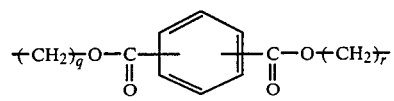

(where $R_3$ is a $C_{1-4}$ alkyl group,
p is an integer of 1 to 10, q and r are each an integer of 1 to 4);
$R_2$ is a $C_{1-6}$ alkyl group or $CH_2$—O—$R_4$ (where $R_4$ is phenyl, an aryl group or a $C_{1-6}$ alkyl group);
Y is a divalent $C_{2-16}$ hydrocarbon group;

Z is $+CH_2)_t\!O-$, $+CH_2-\underset{R_1}{CH}-O)_x$,

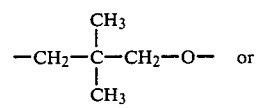

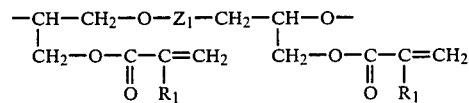

(where t is an integer of 2 to 10, x is an integer of 1 to 30, Z is

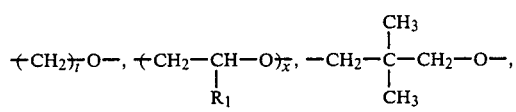

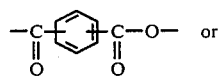

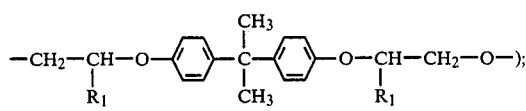

and

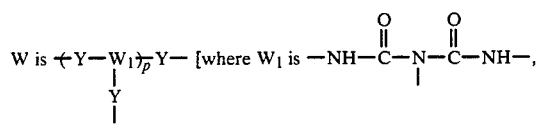

W is $+Y-W_1)_p\!Y-$ [where $W_1$ is $-NH-\underset{\underset{Y}{|}}{\overset{O}{\overset{\|}{C}}}-N-\overset{O}{\overset{\|}{C}}-NH-$,

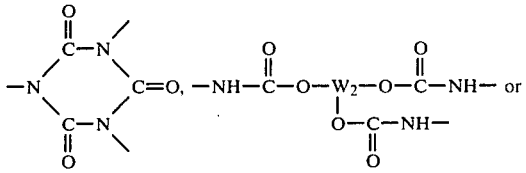

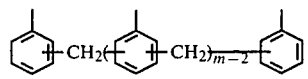

($W_2$ is a trivalent $C_{3-10}$ alkyl group)].

DETAILED DESCRIPTION OF THE INVENTION

As the binder, thermoplastic polymers comprising polymers or copolymers of vinyl monomers may be used. Among them, polymers or copolymers comprising monomers of the formula (D) are preferred:

   (D)

wherein $V_1$ represents hydrogen or methyl and $V_2$ represents phenyl,

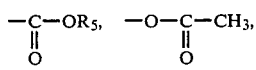

Cl or vinyl ($R_5$ is hydrogen or an alkyl group having 1 to 10 carbon atoms).

It is more preferable to use a polymer or a copolymer comprising a monomer selected from methyl methacrylate, methyl acrylate, butyl acrylate, methacrylic acid, acrylic acid, styrene and butadiene.

The molecular weight of the binder may preferably be 20,000 to 500,000, more preferably 50,000 to 300,000, in terms of weight average molecular weight. If the molecular weight is too large, developing timee will be undesirably prolonged. On the contrary, a binder with too small molecular weight will lower disadvantageously the mechanical strength of the cured resist.

The photopolymerizable unsaturated compound to be used in the present invention is required to have a value of its molecular weight divided by the number of double bonds which is not more than 1000, preferably from 100 to 700. The photopolymerizable unsaturated compound is selected from those having the formula (A), (B) or (C) as specified above, but a combination of plural kinds of photopolymerizable unsaturated compounds may also be used. To describe about the formula (A), the upper limit of n is determined spontaneously depending on the molecular weight per double bond of the compound. $R_1$ may preferably be hydrogen from standpoint of polymerizability. X may preferably be $+CH_2)_k$ wherein k is an integer of 1 to 6,

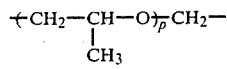

wherein p is an integer of 1 to 10, or

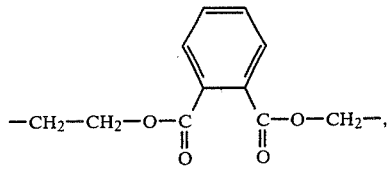

particularly —CH$_2$—.

As R$_2$, an alkyl group having 1 to 4 carbon atoms are preferred. More preferably, methyl and ethyl may be employed. Y should preferably be selected from the groups as set forth below:

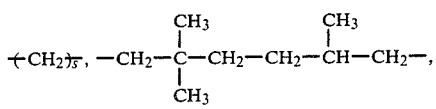

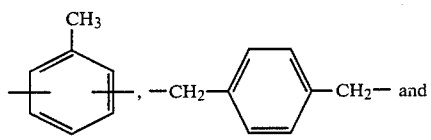

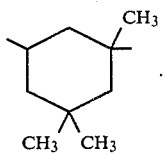

(s is an integer of 2 to 8).

Among them, hexamethylene group, 2,2,5-trimethylhexamethylene group and toluylene group are further preferred. Z may preferably be

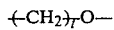

or

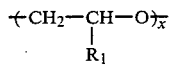

(where t is an integer of 2 to 10 and x is an integer of 1 to 30). The values of t and x are also spontaneously limited by limitation of the molecular weight of the compound. As R$_1$, methyl is preferred here.

In the formula (B),

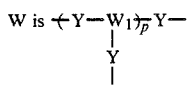

and W$_1$ may preferably be one selected from the following structures (E$_1$) to (E$_4$):

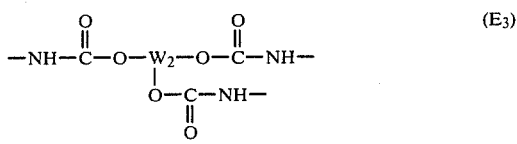

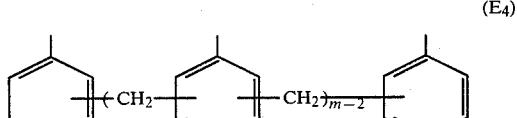

wherein W$_2$ is a trivalent alkyl group having 3 to 10 carbon atoms and m is an integer of 3 to 10.

Among them, a compound wherein W$_1$ has the structure (E$_1$), Y is hexamethylene or wherein W$_1$ has the structure (E$_3$), W$_2$ is represented by the structure (E$_5$) and Y is hexamethylene or toluylene is particularly preferred:

Of the formulae (A), (B) and (C), those represented by the formula (A) are preferred as the photopolymerizable unsaturated compound, and a mixture of the compounds with n being from 0 to 2 or 3 is preferred.

Next, an example of the method for preparation of these compounds is briefly described. Among the compounds represented by the formula (A), the compound of n=0 can be obtained from the reaction between a starting monomer represented by the formula (F$_1$) and a diisocyanate represented by the formula (F$_2$):

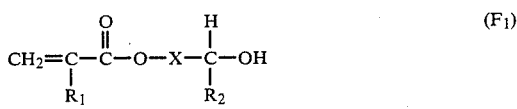

If a diol represented by the (F$_3$) is further permitted here to be co-present with the above monomers, compounds represented by the formula (A) of n=1 or more will be formed, simultaneously with formation of the compound of n=0:

Further, the compound represented by the formula (B) is the reaction product between a monomer represented by the formula (F₁) and a polyisocyanate represented by the formula (F₄):

$$W\text{-}(NCO)_m \qquad (F_4)$$

Here, if a diol represented by the formula (F₃) is permitted to coexist, the compound represented by the formula (C) will also be formed. In the above formulae, $R_1$, $R_2$, X, Y, Z, W and m have the same meanings as defined above.

Preferable examples of the monomer (F₁) may include 2-hydroxypropyl acrylate, 2-hydroxypropyl methacrylate, 2-hydroxybutyl acrylate, 2-hydroxy-3-phenoxypropyl acrylate, polypropyleneglycol monoacrylate, polypropyleneglycol monomethyacrylate, acryloxyethyl-2-hydroxypropyl phthalate, methacryloxyethyl-2-hydroxypropyl phthalate and the like.

Preferable examples of the diisocyanate (F₂) may include hexamethylene diisocyanate, toluylene diisocyanate, 4,4'-diphenylmethane diisocyanate, xylylene diisocyanate, isophorone diisocyanate, 2,2,5-trimethylhexamethylene diisocyanate and the like.

Typical examples of the diol (F₃) are ethylene glycol, propylene glycol, butane diol, hexane diol, and further diols represented by the formula (F₅):

$$\begin{array}{c} HO-CH-CH_2-O-Z_1-CH_2-CH-OH \\ | \qquad\qquad\qquad\qquad\qquad | \\ CH_2-O-C-C=CH_2 \quad CH_2-O-C-C=CH_2 \\ \| \; | \qquad\qquad\qquad\qquad \| \; | \\ O \; R_1 \qquad\qquad\qquad\qquad O \; R_1 \end{array} \qquad (F_5)$$

wherein $R_1$ is hydrogen or methyl, and $Z_1$ is preferably $-(CH_2)_{t'}O-$ or $$-(CH_2-CH-O)_{x'}-$$
$$\quad\; |$$
$$\quad R_1$$

(t' and x' is each an integer of 1 to 10).

Typical examples of the polyisocyanate (F₄) are water adducts of hexamethylene diisocyanate, isophorone diisocyanate and toluylene diisocyanate, respectively, and trimethylol propane adduct.

The reaction should desirably be conducted in a solvent. As the solvent, aromatic hydrocarbons such as toluene or xylene, esters such as ethyl acetate, butyl propionate, ketones such as acetone, methyl ethyl ketone or methyl isobutyl ketone are preferred. While the reaction can proceed under either absence or presence of a catalyst, it is preferred to use a catalyst in order to carry out the reaction rapidly. As the catalyst, there may be employed, for example, a tertiary amine such as triethylamine or triethylene diamine, or a organo tin compound such as stannous octoate or dibutyltin dilaurate.

It is also desirable to carry out the reaction under the conditions where the carbon-carbon double bonds in the compound (F₁) or (F₅) will not be polymerized. For this purpose, the reaction temperature should be 80° C. or lower, preferably 50° C. or lower. The reaction is also desired to be conducted, while shielding the reaction system from light.

Further, it is preferable to react one equivalent or more of hydroxyl groups per one equivalent of isocyanate group to avoid free isocyanate groups.

The monomeric component in the photopolymerizable layer in the present invention may also contain other photopolymerizable compounds, if desired, provided such compounds are not main components in the monomeric component.

Such photopolymerizable compounds may include monomers represented by the following formulae;

$$\begin{array}{c} H \qquad Z_2 \\ \diagdown \quad \diagup \\ C=C \\ \diagup \quad \diagdown \\ H \qquad Z_3 \end{array} \qquad (F_6)$$

wherein $Z_2$ is hydrogen, methyl or halogen and $Z_3$ is phenyl, vinyl phenyl, cyano, halogen, pyridyl, imidazolyl or $-CO-O-Z_4$ (wherein $Z_4$ is $C_{1-12}$ alkyl group, $C_{6-10}$ cycloalkyl group, allyl, benzyl, $C_{2-6}$ hydroxyalkyl group, $C_{3-8}$ dialkylaminoalkyl group, $C_{1-6}$ halo alkyl group, tetrahydrofurfuryl, halo phenyl, ethoxyethoxyethyl or hydrogen), and including, for example, styrene; divinylbenzene; acrylonitrile; methacrylonitrile; monoacrylates such as ethyl acrylate, isopropyl acrylate, butyl acrylate, cyclohexyl acrylate, benzyl acrylate, 2-ethylhexyl acrylate, lauryl acrylate, carbitol acrylate, methoxypolyethylene glycol acrylate, 2-hydroxyethyl acrylate, 2-hydroxypropyl acrylate, 2-hydroxy-3-chloropropyl acrylate, 1,4-butyleneglycol monoacrylate, dimethylaminoethyl acrylate, diethylaminoethyl acrylate, tetrahydrofurfuryl acrylate, 2-chloroethyl acrylate, 2,3-dibromopropyl acrylate, tribromophenyl acrylate, allyl acrylate, α-chloroacrylonitrile, vinyl pyridine, vinyl imidazole and so on;

$$\begin{array}{c} CH_2=C-C-O-Z_5-O-C-C=CH_2 \\ | \; \| \qquad\qquad\qquad \| \; | \\ R_1 \; O \qquad\qquad\qquad O \; R_1 \end{array} \qquad (F_7)$$

wherein $Z_5$ is $C_{2-10}$ divalent alkyl group or $$-(CH-CH_2-O)_{l}CH-CH_2-$$
$$\quad\; | \qquad\qquad\qquad\qquad |$$
$$\quad R_1 \qquad\qquad\qquad\qquad R_1$$

(wherein l is an integer of 1 to 20 and $R_1$ is hydrogen or methyl) and $R_1$ is the same as defined above, and including, for example, acrylic acid esters or methacrylic acid esters of diols such as pentane diol, hexane diol, ethylene glycol, tetraethylene glycol, nonaethylene glycol, polyethylene glycol, neopentane diol, polypropylene glycol and the like;

$$\begin{array}{c} \qquad\qquad O \qquad\qquad\qquad O \; R_1 \\ \qquad\qquad \| \qquad\qquad\qquad \| \; | \\ CH_2=C-C-O-Z_6-O-C-C=CH_2 \\ | \qquad\qquad | \\ R_1 \qquad\qquad O-C-C=CH_2 \\ \qquad\qquad\qquad \| \; | \\ \qquad\qquad\qquad O \; R_1 \end{array} \qquad (F_8)$$

wherein $Z_6$ is $C_{3-12}$ trivalent alkyl group, $C_{6-14}$ trivalent alkoxyalkyl group or

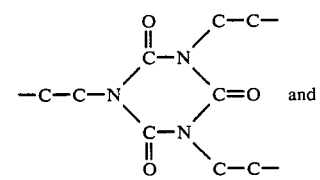

and $R_1$ is the same as defined above, and including, for example, trimethylolpropane, triacrylate, tri(acryloxypropoxy)hexane, tri(acryloxypropoxy)propane, tris(hydroxyethyl)triazine acrylate and methacrylic acid esters corresponding to these;

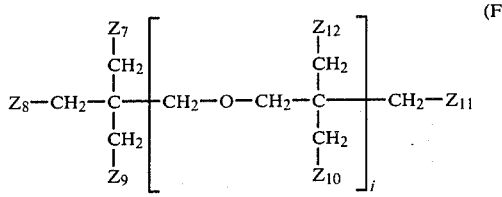 (F9)

wherein at least three of $Z_7$–$Z_{12}$ are

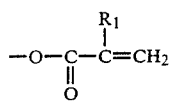

(wherein $R_1$ is hydrogen or methyl) and the remaining are hydroxyl groups and i is 0 or 1, and including, for example, pentaerythritol triacrylate, pentaerythritol tetraacrylate, dipentaerythritol hexaacrylate, dipentaerythritol pentaacrylate, dipentaerythritol tetraacrylate and dipentaerythritol triacrylate;

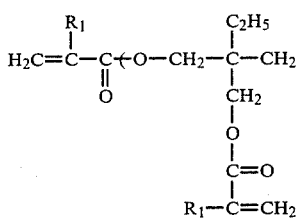 (F10)

wherein $Z_{13}$ is $C_{1-8}$ divalent alkyl group,

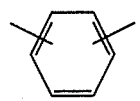

or

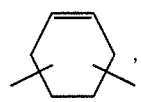

$R_1$ is the same as defined above and j is an integer of 2 to 6, and including, for example, "ARONIX" (product of Toa Gosei Kagaku Kogyo Kabushiki Kaisha);

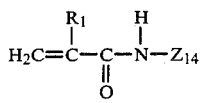 (F11)

wherein $Z_{14}$ is $C_{1-10}$ alkyl group, $C_{1-6}$ hydroxyalkyl group or

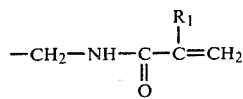

and $R_1$ is the same as defined above, and including, for example, acrylamide, methylenebisacrylamide, N-t-butylacrylamide, N-t-octylacrylamide, N-methylolacrylamide, N-butoxymethylacrylamide and methacrylamides corresponding to these;

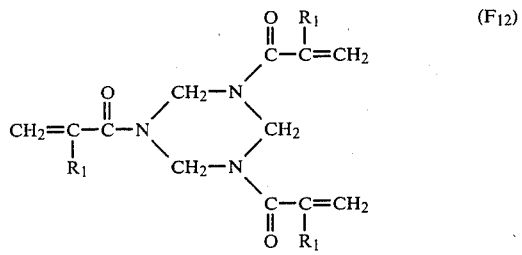 (F12)

wherein $R_1$ is the same as defined above;

(F13)

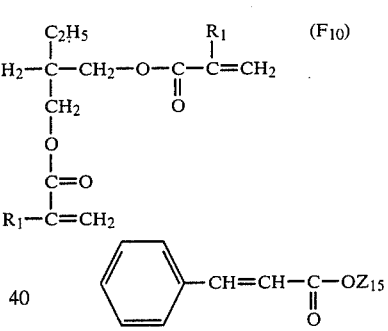

wherein $Z_{15}$ is hydrogen or $C_{1-10}$ alkyl group, and including, for example, cinnamic acid, ethyl cinnamate and propyl cinnamate;

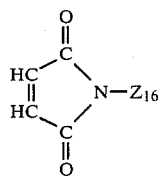 (F14)

wherein $Z_{16}$ is hydrogen, phenyl or

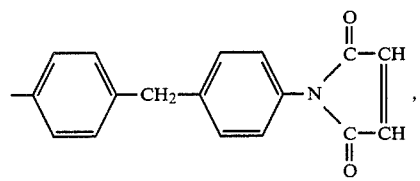

and including, for example, maleimide, phenyl maleimide and diphenylmethane bismaleimide; diacrylates or dimethacrylates represented by the following formula (F15),

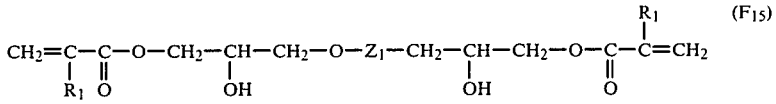

wherein $R_1$ and $Z_1$ are the same as defined above; and diacrylates or dimethylacrylates represented by the following formula ($F_{16}$),

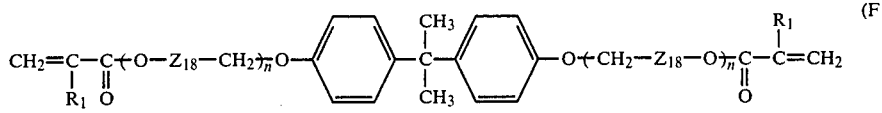

wherein $Z_{18}$ is $-CH_2-$,

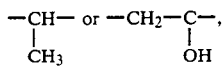

$R_1$ is the same as defined above and n is an integer of 1 to 4.

Examples of photopolymerization initiators or photosensitizers available in the present invention may include, for example, polynucleus quinones such as benzoin, benzoin alkyl ethers, anthroquinone and the like; dyes and electron-donating substances such as benzophenone, chlorobenzophenone, Michler's ketone, fluorenone, thioxanthone, dialkylthioxanthone, halogenated thioxanthone, isoamyl dimethylaminobenzoate, ethyl dimethylaminobenzoate, naphthalene sulfonyl chloride, azobisisobutyronitrile, 1-azobis-1-cyclohexanecarbonitrile, 2,4-dichlorobenzoyl peroxide, diphenyl disulfide, dibenzothiazole, 1-(4-isopropylphenyl)-2-hydroxy-2-methylpropane-1-one, 2-hydroxy-2-methyl-1-phenylpropane-1-one, erythroycin and the like; triethylamine, p-aminobenzoic acid esters, triphenylphosphine, 2,2-dimethoxy-2-phenylacetophenone, and so on. These photopolymerization initiators or photosensitizers may be used either individually or as a combination of two or more compounds.

The weight percentages of the components based on the total weight of the polymerizable layer are 5 to 95%, preferably 20 to 80%, more preferably 30 to 70% for the binder; 95 to 5%, preferably 80 to 20%, more preferably 70 to 30%, for the monomeric component; and the monomeric component contains at least 50% by weight of at least one compound selected from the group consisting of the compounds represented by the formulae (A), (B) and (C). The content of the photopolymerization initiator may be 0.01 to 30%, preferably 0.1 to 15%, more preferably 1 to 10%.

Further, in the photopolymerizable layer of the present invention, it is possible to add additives such as dyes, stabilizers, copper surface adherents, plasticizers, etc.

The photopolymerizable layer may have a thickness which may differ depending on the purpose of use, but may preferably be 5 to 150 μm, more preferably 5 to 70 μm, for use in preparation of a printed circuit board, with resolution being enhanced as the thickness in thinner.

The support layer to be used in the photopolymerizable laminate of the present invention may be either transparent or opaque to active rays, but desirably transparent transmissive of active rays in view of the working operations in the image forming step.

As the support layer transmissive of active rays, there may be included films of polyethyleneterephthalate, polyvinyl alcohol, polyvinyl chloride, vinyl chloride copolymer, polyvinylidene chloride, vinylidene chloride copolymer, polymethyl methacrylate, methyl methacrylate copolymer, polystyrene, styrene copolymer, polyamide and cellulose derivatives.

As already described above, the process, in which resist images are formed by subjecting both of the support layer and the photopolymerizable layer as such without peeling the support layer off from the photopolymerizable layer to developing for removal of the unexposed portions, has the advantages of simplification of the process and stability of images. To be applied for this process, the support layer is required to be a material which can be dissolved or dispersed in a solvent which dissolve or disperse the photopolymerizable layer. As the support layer, it is particularly preferred to use a film of polymethyl methacrylate, methyl methacrylate copolymer, polystyrene or styrene copolymer with respect to its solubility when the liquid for developing is an organic solvent, or to use a polymeric film containing amino groups, ammonium groups, hydroxyl groups, carboxylic groups or salts thereof, such as polyvinyl alcohol film, cellulose derivative film, when the liquid for developing is aqueous.

The protective layer may exist on the surface of the photopolymerizable layer, and must be easily peeled off from the photopolymerizable layer. For this purpose, polyethylene film, polypropylene film, Cellophane, peeling paper or polyethyleneterephthalate treated with peeling agent is preferably used as the protective film.

The photopolymerizable layer disclosed in the present invention can be hardened by irradiation of active rays, and the active rays herein mentioned refers to visible light, UV-ray and electron beam. As the light source, there are the sun, arc lamp, mercury lamp, high pressure mercury lamp, ultra-high pressure mercury lamp, sterilizing lamp, xenon lamp and fluorescent lamp.

The photopolymerizable laminate disclosed in the present invention is particularly useful for use in formation of printed circuit board. In both of the cases of the copper thru-hole process according to the tenting method and the solder thru-hole process, the present photopolymerizable laminate can be used in conventional manner widely known in the art to prepare print wiring plates with very good results. In the tenting method, as reflected by the high mechanical strength of the hardened film and good adhesion to the substrate, there is little damage on the sealing film for thru-hole during developing or etching. On the other hand, in the solder thru-hole method, during plating, good plating resistance was exhibited without any plating solution penetrated into the surface between the resist and the substrate. Also, since the unexposed portion can be completely removed by developing, etching or plating can be applied very evenly. Further, the present photopolymerizable layer has a high photosensitivity, which will bring about shortening of the exposure time. That is, by use of the photopolymerizable laminate disclosed in the present invention, one can enjoy the advantages that a high density and high precision printed circuit board can be prepared easily, and also that the step of preparing the printed circuit board can be simplified.

Another superiority of the present invention is the fact that the photopolymerizable laminate of the present invention is applicable without causing a problem such as cracks for a more preferable process, in which the flexible support layer is removed by developing as such, without peel-off from the photopolymerizable layer, together with the unexposed portion of the photopolymerizable layer.

It can be also applied for preparation of decorative panels or printing plates.

The present invention is further illustrated by referring to the following Examples, by which the present invention is not limited at all.

REFERENCE EXAMPLE 1

Into a four-necked flask of 2-l volume equipped with a dropping funnel, a thermometer and a stirrer, 168 g of hexamethylene diisocyanate as the compound ($F_2$), 80 g of methyl ethyl ketone as the Solvent 1 and 0.6 g of dibutyltin dilaurate as the catalyst were charged. While stirring the mixture, a mixture of 286 g of 2-hydroxypropyl acrylate as the compound ($F_1$) and 65 g of methyl ethyl ketone as the Solvent 2 was added dropwise at an inner temperature which was controlled to be not higher than 35° C. After the dropwise addition, stirring was continued at 40° C. for 30 hours until the characteristic absorption of the isocyanate groups at around 2270 $cm^{-1}$ in IR-absorption spectrum was confirmed to have substantially disappeared. Then, as the Solvent 3, 50 g of methyl ethyl ketone was added. This reaction product is called as C-1.

REFERENCE EXAMPLE 2

Into the same flask as in Reference Example 1, 350 g of 2,4-toluylene diisocyanate as the compound ($F_2$), 80 g of acetone and 0.64 g of dibutyltin dilaurate were charged, and a mixture of 336 g of 2-hydroxypropyl acrylate as the compound ($F_1$), and 215 g of acetone was added to the resultant mixture under stirring. After addition, stirring was continued for 25 hours, during which the inner temperature was controlled at not higher than 40° C. A part of the reaction mixture was sampled and mixed with equal amount of ethanol, and the mixture left to stand at 50° C. for one hour. This sample was subjected to gel permeation chromatography. As the result, no adduct of tolulyene diisocyanate and ethanol was recognized and tolulyene diisocyanate was confirmed to be consumed in the reaction. This reaction mixture is called as C-2.

REFERENCE EXAMPLE 3

Into a three-necked flask of one liter volume, 97.7 g of propylene glycol glycidylether diacrylate (Denacolacrylate DA-911, hydroxyl equivalence=222, produced by Nagase Sangyo Co., Ltd.), 280 g of C-2 as prepared above, 0.3 g of dibutyltin dilaurate and 75 g of acetone were charged. Under magnetic stirring, the reaction was continued at 30° C. for 4 hours and further at 45° C. for 12 hours. Completion of the reaction was confirmed by IR-absorption spectrum. This product is called as C-3.

REFERENCE EXAMPLE 4

Into the same flask as employed in Reference Example 1, 100 g of hexamethylene diisocyanate as the compound ($F_2$), 0.35 g of dibutyltin dilaurate as the catalyst and 70 g of ethyl acetate as the Solvent 1 were charged. While stirring the mixture, a mixture of 200 g of polyethylene glycol (average molecular weight 200) as the compound ($F_3$) was added dropwise over 2 hours. During the addition, the inner temperature was controlled to be not higher than 40° C. by controlling the temperature of the water bath and the dropping rate. Further, after stirring at 40° C. for one hour, 134 g of 2-hydroxypropyl acrylate as the compound ($F_1$) was added dropwise at an inner temperature controlled to be not higher than 40° C. Then, the mixture was stirred at 40° C. for 48 hours, and 100 g of ethyl acetate as the Solvent 2 was added to give a homogeneous solution. This is called as C-4.

REFERENCE EXAMPLES 5-13

Using the device and the method as described in Reference Example 1, various monomeric components [Reaction product (C)] were prepared. The starting materials and their amounts charged are shown in Table 1. As the catalyst, in every case, dibutyltin dilaurate was used. The products in respective Reference examples are called as C-5 to C-13.

| Notes for Table 1 |
| --- |
| (*1) IPDI: isophorone diisocyanate |
| (*2) HPA: 2-hydroxypropyl acrylate |
| (*3) DNT: HMDI adduct (DURANATE 24A-100, produced by Asahi Kasei Kogyo Kabushiki Kaisha) |
| (*4) MEK: methyl ethyl ketone |
| (*5) B-1: 2-hydroxy-3-phenoxypropyl acrylate (ARONIX 5700, produced by Toa Gosei Kagaku Kogyo Co., Ltd.) |
| (*6) HMDI: hexamethylene diisocyanate |
| (*7) CHL: HMDI trimethylolpropane adduct (CORONATE HL, NCO content 12.8%, 75% ethyl acetate solution, produced by Nippon Polyurethane Kogyo Co., Ltd.) |
| (*8) CL: trimethylolpropane toluylene diisocyanate adduct (CORONATE L, NCO content 13.2%, 75% ethyl acetate solution, produced by Nippon Polyurethane Kogyo Co., Ltd.) |
| (*9) B-2: polypropyleneglycol monomethacrylate (BLEMMER P-1000 average molecular weight 370, produced by Nippon Yushi Co., Ltd.) |
| (*10) TMHMDI: trimethylhexamethylene diisocyanate |
| (*11) TDI: toluylene diisocyanate |
| (*12) MDI: diphenylmethane diisocyanate |
| (*13) HPMA: 2-hydroxypropyl methacrylate |

REFERENCE EXAMPLE 14

Reference Example 4 was repeated except for employing 96 g of DNT (*3 in Table 1) as the compound ($F_2$), 80 g of methyl ethyl ketone as the Solvent 1, 200 g of polyethylene glycol (average molecular weight 200) as the compound ($F_3$), 52 g of 2-hydroxypropyl acrylate as the compound ($F_1$), 32 g of methyl ethyl ketone as the Solvent 2, and a separate flask of one liter volume as the reaction vessel. As the result, the product C-14 was obtained.

REFERENCE EXAMPLE 15

Into a separable flask of 5-l volume equipped with a stirrer and a reflux condenser, 2000 g of deionized water was charged and 10 g of methyl cellulose (METOLOSE SN-100, produced by Shinetsu Kagaku Co., Ltd.) and 5 g of sodium chloride were dissolved therein. With stirring at 75° C., a homogeneous mixture comprising 480 g of methyl methacrylate and 20 g of butyl acrylate as the monomers, 2.5 g of azobisisobutyronitrile and 1 g of dodecyl mercaptan was charged into the solution. About one hour later, the inner temperature began to be elevated until reaching 90° C. When the inner temperature lowered to 80° C., the water bath was heated to 80° C., whereat the mixture was stirred for 2 hours and further at 90° C. for one hour. Then, the contents were poured into a metal sieve of 300 mesh and washed with sufficient amount of water. As the result, a polymer in shape of beads with particle sizes of 100 to 400 μm was obtained, which was then dried. This polymer is called as B-15. This B-15 was analyzed by gel permeation chromatography to find that it had a weight-average molecular weight of 176000.

EXAMPLE 1

Into a 300-ml separable flask equipped with a stirrer, 49 g of B-15 as the binder, 53 g of C-1 as the monomeric component, 2 g of benzophenone and 0.2 g of Michler's ketone as the initiators, Diaresin Blue P (produced by Mitsubishi Kasei Kogyo Co., Ltd.) as the dye, 0.2 g of benzotriazole and 30 mg of p-methoxyphenol as the additives, and 84 g of ethyl acetate as the solvent were charged, followed by stirring for 15 hours. Then, a support of polyethyleneterephthalate film with a thickness of 20 μm was coated by means of a blade coater with the above mixture, dried on air for 30 minutes and then in an oven at 60° C. for 15 minutes. The photopolymerizable layer obtained had a thickness of 35 μm. Next, after a polyethylene film with a thickness of 25 μm as the protective layer was laminated on the photosensitive layer by pressure rollers, the laminate was bonded onto a copper-clad laminate by pressure rollers at 80° C., while peeling off the above polyethylene film. This laminate was exposed to light through a nega-mask film at a dose of 100 mJ/cm$^2$ using a ultra-high pressure mercury lamp (Phoenix Model 3000, produced by Oak Seisakusho). Subsequently, the polyethyleneterephthalate film was peeled off, and the unexposed portion was dissolved and removed by spraying 1,1,1-trichloroethane through a spray nozzle for 120 seconds. As the result, good image was obtained (this is called as Resist image). It was confirmed that it exhibited a resolution of 40 μm. Next, when the exposed copper face was etched by spraying a ferric chloride solution of 50° C. for 2 minutes, no image flow was observed.

EXAMPLE 2

In a 10-l separable flask equipped with a stirrer and a reflux condenser, 1960 g of a binder of methacrylic resin (DELPET 70H, produced by Asahi Kasei Kogyo Kabushiki Kaisha) was dissolved in 3000 g of methyl ethyl ketone as the solvent under stirring at 70° C., followed by addition of 1880 g of C-4 and 332 g of dipentaerythritol pentaacrylae (DPHA produced by Nihon Kayaku Co., Ltd.) as the monomeric components, 80 g of benzophenone and 8 g of Michler's ketone as initiators, 20 g of Dia Resin Blue-P as the dye, 8 g of benzotriazole and 1.3 g of p-methoxyphenol as the additives. The mixture was stirred for 6 hours, and the resultant solution was applied by means of a coating machine of a 38 μm polyethylene film as the protective layer, followed by drying of the solvent, to form a photosensitive layer with a thickness of 40 μm. This laminate was wound up in a roll while being covered with a 15 μm oriented polystyrene film for the support. This laminate is called as L-12. Next, by use of AL 700 (laminator: product of Asahi Kasei Kogyo Kabushiki Kaisha) the photosensitive layer supported on the polystyrene was laminated by adhesion on both surfaces of a thru-hole

TABLE 1

| Reference Example | Compound (F$_2$) | (g) | Compound (F$_1$) | (g) | Solvent 1 | (g) | Solvent 2 | (g) | Solvent 3 | (g) | Catalyst (g) |
|---|---|---|---|---|---|---|---|---|---|---|---|
| 5 | IPDI*[1] | 444 | HPA*[2] | 546 | MEK*[4] | 88 | — | — | MEK | 220 | 0.4 |
| 6 | DNT*[3] | 478 | 2-HPA | 455 | Acetone | 400 | — | — | Acetone | 216 | 0.5 |
| 7 | HMDI*[6] | 478 | B-1*[5] | 489 | Ethyl acetate | 96 | Ethyl acetate | 100 | Ethyl acetate | 212 | 0.5 |
| 8 | CHL*[7] | 656 | HPA | 286 | — | — | — | — | Ethyl acetate | 235 | 0.6 |
| 9 | DNT | 478 | HPMA*[13] | 151 | Acetone | 129 | — | — | MEK | 500 | 0.5 |
| 10 | CL*[8] | 320 | HPA | 430 | Ethyl acetate | 150 | — | — | Ethyl acetate | 600 | 0.6 |
| 11 | TDI*[11] | 348 | HPA | 572 | MEK | 196 | — | — | MEK | 200 | 0.7 |
| 12 | MDI*[12] | 500 | HPA | 572 | Toluene | 168 | — | — | Toluene | 200 | 1 |
| 13 | TMHMDI*[10] | 112 | B-2*[9] | 400 | MEK | 120 | MEK | 120 | MEK | 120 | 0.5 | substrate (copper-clad laminate with 1064 holes with 4.0 mm diameter being bored at intervals of 4.0 mm, with the thru-hole portions also subjected to copper plating), while peeling off the polyethylene film, to obtain a laminated substrate. The heating rolls of the laminator were set at 80° C. After irradiation of light at a dose of 120 mJ/cm$^2$ by use of a ultra-high pressure mercury lamp on the laminated substrate, developing was conducted by spraying 1,1,1-trichloroethane for 120 seconds and the number of the breaking of the hardened film on the thru-holes was counted. As the result, no breaking was observed. (This test is called as Tenting-I).

Then, the above substrate subjected to development processing was subjected to etching operation by spraying ferric chloride solution of 50° C. for 2 minutes, whereby no breaking was observed. (This test is called as Tenting-II). Next, by using another laminated substrate, exposure was effected on both surfaces through a land mask under the above conditions to form hardened films with a diameter of 4.6 mm on both openings of respective thru-holes, and thereafter the tests were conducted similarly as Tenting-I and II. The respective tests are called as Land I and II, but no breaking of hole was observed.

EXAMPLE 3

A photosensitive composition was prepared according to the same recipe as in Example 1 except for using no dye. A photosensitive layer was formed to a thickness of 120 μm on a polyethyleneterephthalate film with a thickness of 38 μm, and the laminate covered with polyethylene film was wound up in a roll. While peeling off the polyethylene film from the laminate, the laminate was subjected to lamination on a plywood with rubber rolls. After exposure by means of a high pressure mercury lamp at a dose of 400 mJ/cm$^2$, the polyethyleneterephthalate film was peeled off, whereby a tough coated film was formed on the plywood. This film had a pencil hardness of 4H. Further, exposure test was conducted by means of a weather-o-meter for 500 hours. As the result, no change was observed in appearance, surface hardness and adhesion to the plywood.

EXAMPLES 4–17

Using the same laminator as in Example 2, dry film resist laminates were formed according to the same method. The starting materials and their amounts, thicknesses of the resist layers, the protective layers and supports are listed in Table 2. For respective Examples, 0.2% of benzotriazole and 0.05% of p-methoxyphenol were added based on the total weight of the monomer and the binder to prepare resist solutions. The laminates obtained are called as L-4 to L-17, respectively.

In Examples 5, 6, 12, 13, 14 and 17, as different from Example 2, protective films were laminated after formation of photosensitive layers on supports to prepare laminates shaped in rolls. Further, the support layer was peeled off before the developing process. The results of tenting and land tests are also listed in Table 3.

TABLE 3

| Example | Number of Broken Holes | | | |
|---|---|---|---|---|
| | Tenting I | Tenting II | Land I | Land II |
| 2 | 0 | 0 | 0 | 0 |
| 4 | 0 | 0 | 0 | 0 |
| 5 | 0 | 0 | 0 | 0 |
| 6 | 0 | 0 | 0 | 0 |
| 7 | 0 | 0 | 0 | 0 |
| 8 | 0 | 1 | 0 | 1 |
| 9 | 0 | 0 | 0 | 0 |
| 10 | 0 | 0 | 0 | 0 |
| 11 | 0 | 1 | 0 | 0 |
| 12 | 0 | 0 | 0 | 0 |
| 13 | 0 | 0 | 0 | 0 |
| 14 | 0 | 0 | 0 | 0 |
| 15 | 0 | 1 | 0 | 1 |
| 16 | 0 | 0 | 0 | 0 |
| 17 | 0 | 0 | 0 | 0 |

(Note)

(Monomeric component)

M-1: "ARONIX M-305", produced by Toa Gosei Kagaku Kogyo Co., Ltd. (main component: pentaerythritol triacrylate).

M-2: "D-330", produced by Nihon Kayaku Co., Ltd. (main component: dipentaerythritol triacrylate).

M-3: "EPOXYESTER 70 PA", produced by Kyoei Yushi Kagaku Kogyo Co., Ltd. (main component: propyleneglycol diglycidylether-acrylilc acid adduct).

M-4: "BISCOAT 3700", produced by Osaka Yuki Kagaku Kogyo Co., Ltd. (main component: bis(1,5-pentanediol)phthalic anhydride-acrylic acid ester).

M-5: "EPOXYESTER BP-4PA", produced by Kyoei Yushi

TABLE 2

| Example | Monomeric Component (g) | Binder (g) | Initiator (g) | Dye (g) | Solvent (g) | Thickness (μm) | Protective layer | Support layer |
|---|---|---|---|---|---|---|---|---|
| 4 | C-1 (380) C-3 (157) | B-1 (520) | I-1 (10) I-2 (40) | D-1 (15) | Acetone (770) | 48 | P | S |
| 5 | C-1 (650) C-6 (60) | B-15 (460) | I-5 (20) I-4 (1.5) | D-2 (1.2) | MEK (640) | 47 | E | T |
| 6 | C-7 (335) C-13 (266) M-1 (100) | B-2 (400) | I-3 (25) I-4 (3) | D-3 (1.5) | Toluene (800) | 25 | P | T |
| 7 | C-1 (295) C-10 (240) M-2 (140) | B-3 (480) | I-6 (50) I-7 (10) | — | Toluene (680) | 40 | P | S |
| 8 | C-9 (350) M-5 (250) | B-1 (500) | I-8 (15) I-9 (40) | D-1 (2) | Acetone (800) | 49 | E | S |
| 9 | C-4 (56.6) M-6 (94) | B-15 (460) | I-1 (8) I-2 (8) I-6 (50) | Rose-bengal[1] | Toluene (720) | 42 | P | S |
| 10 | C-5 (540) C-6 (55) | B-1 (463) | I-3 (20) I-4 (1.5) | D-2 (2) | Acetone (750) | 28 | P | S |
| 11 | M-7 (300) M-8 (100) | B-1 (500) | I-1 (15) I-2 (35) | — | Ethyl acetate (970) | 40 | P | S |
| 12 | M-9 (370) M-5 (180) | B-6 (400) | I-10 (25) I-4 (3) | D-3 (2) | Ethyl acetate (950) | 43 | E | T |
| 13 | C-14 (283) C-1 (28.5) M-10 (150) | B-4 (400) | I-10 (25) I-4 (3) | D-4 (2) | Ethyl acetate (840) | 37 | E | T |
| 14 | C-14 (740) C-13 (30) | B-4 (421) | I-3 (20) I-4 (1.5) | — | MEK (680) | 48 | E | T |
| 15 | C-12 (337) M-3 (120) | B-15 (560) | I-3 (18) I-4 (2.5) I-6 (20) | D-4 (1.5) | MEK (900) | 42 | E | S |
| 16 | C-4 (620) C-11 (63) | B-5 (500) | I-3 (10) I-4 (30) I-6 (40) | — | Ethyl acetate (732) | 38 | P | S |
| 17 | C-1 (200) C-8 (70) M-4 (100) | B-15 (600) | I-8 (20) I-9 (0.7) I-6 (50) | D-1 (1.5) | MEK (850) | 45 | E | T |

-continued (Note)

| | |
|---|---|
| | Kagaku Kogyo Co., Ltd. |
| M-6: | "ARONIX 8100", produced by Toa Gosei Kagaku Kogyo Co., Ltd. (polyfunctional acrylic acid ester). |
| M-7: | "BISCOAT 823", produced by Osaka Yuki Kagaku Kogyo Co., Ltd. (non-yellow discoloration type urethane acrylate, average molecular weight 1350). |
| M-8: | "R-526", produced by Kyoei Yushi Kagaku Kogyo Co., Ltd. (polyester type diacrylate). |
| M-9: | "ARONIX M-1200", produced by Toa Gosei Kagaku Kogyo Co., Ltd. (non-yellow discoloration type urethane acrylate). |
| M-10: | "SP-4010", produced by Showa Kobunshi Co., Ltd. (special epoxy acrylate). |
| (Binders) | |
| B-1: | "DELPET 80N", produced by Asahi Kasei Kogyo Kabushiki Kaisha. |
| B-2: | "STYRON GP 683", produced by Asahi Kasei Kogyo Kabushiki Kaisha. |
| B-3: | "ACRYPET", produced by Mitsubishi Rayon Co., Ltd. |
| B-4: | "DELPET CR-1", produced by Asahi Kasei Kogyo Kabushiki Kaisha. |
| B-5: | "DELPET 70H", produced by Asahi Kasei Kogyo Kabushiki Kaisha. |
| B-6: | "ASAFLEX AFX-810", produced by Asahi Kasei Kogyo Kabushiki Kaisha. |
| (Initiators) | |
| I-1: | 2,4-diisopropylthioxanthone |
| I-2: | isopropyl 4-(dimethylamino)benzoate |
| I-3: | benzophenone |
| I-4: | 4,4'-bis(dimethylamino)benzophenone (Michler's ketone) |
| I-5: | fluorein |
| I-6: | dimethylbenzyl ketal |
| I-7: | triphenyl phosphine |
| I-8: | 4-chlorothioxanthone |
| I-9: | Ethyl 4-(dimethylamino)benzoate |
| I-10: | 4-chlorobenzophenone |
| (Dyes) | |
| D-1: | "Blue-P" |
| D-2: | "Green-C" |
| D-3: | "Blue-K" |
| D-4: | "Blue-G" (all produced by Mitsubishi Kasei Kogyo Co., Ltd.) |
| (Protective layer) | |
| P: | oriented polypropylene (20 μm) |
| E: | polyethylene (38 μm) |
| (support layer) | |
| S: | oriented polystyrene (15 μm) |
| T: | polyethyleneterephthalate (20 μm) |

EXAMPLE 18

On the copper-clad laminate laminated with the photosensitive layer obtained in Example 1, exposure was effected through a posi-mask film at a dose of 100 mJ/cm$^2$. Then, developing was carried out with 1,1,1-trichloroethane, followed by the pretreatments in the order of immersing in Neutraclean C (Shippley Far East Co., Ltd.) of 40° C. for 3 minutes→washing with water→immersing in 20% aqueous ammonium persulfate for 1 minute→washing with water→immersing in 20% diluted sulfuric acid for 2 minutes→washing with water. Subsequently, copper plating was conducted under the condition C shown in the note in Table 4 and then solder plating under the condition E. As the result, no flow was seen on fine lines of the image. On this image was plastered Cellophane tape, and the tape was peeled off after sufficient adhesion under pressure with the result that there was no peel-off of the resist at all. Also, another substrate subjected to the same pre-treatments as described above was applied with copper plating according to the condition D and E, followed further by solder plating. This product was also free from peel-off of resist in the tape peeling test.

COMPARATIVE EXAMPLE 1

Using a solution prepared according to the following composition, a laminate was prepared in the same manner as in Example 1 (thickness of photopolymerizable layer: 40 μm):

| | |
|---|---|
| B-15 (prepared in Reference Example 15) | 200 g |
| Trimethylolpropane triacrylate | 220 g |
| Benzophenone | 8 g |
| Michlar's ketone | 0.8 g |
| Benzotriazole | 0.8 g |
| p-methoxyphenol | 0.13 g |
| Diaresin Blue-P | 2 g |
| Ethyl acetate | 300 g. |

According to the method as in Example 2, a thru-hole substrate was laminated with this laminate, and tenting and land tests were conducted to obtain the following results.

| Tests | Number of holes broken |
|---|---|
| Tenting I | 8 |
| Tenting II | 15 |
| Land I | 40 |
| Land II | 52 |

Further, plating test was conducted similarly as in Example 18. As the result, the hardened photosensitive layer on both sides of the plated image was peeled off with widths of 0.1–0.5 mm.

EXAMPLE 19

According to the same procedure as in Comparative Example 1, except that 140 g of trimethylolpropane triacrylate was replaced with C-1, a laminate was prepared. This laminate is called as L-19.

EXAMPLES 20–35

Using the dry film resist laminates obtained in Examples 2, 4 through 17 and 19, the same plating operations as in Example 18 were repeated, and plating resistance of the resists was tested. The results are shown in Table 4. Plating pre-treatments, plating conditions and the results of tape peeling tests are as described in the notes in Table 4.

TABLE 4

| | | Plating Condition | | |
|---|---|---|---|---|
| Example | Laminate | A-C-E | B-C-E | A-D-E |
| 20 | 2 | a | a | b |
| 21 | 4 | b | a | a |
| 22 | 5 | a | a | b |
| 23 | 6 | b | b | b |
| 24 | 7 | a | a | a |
| 25 | 8 | a | b | a |
| 26 | 9 | a | a | a |
| 27 | 10 | a | a | b |
| 28 | 11 | a | a | b |
| 29 | 12 | b | b | b |
| 30 | 13 | a | a | a |
| 31 | 14 | a | a | b |
| 32 | 15 | a | b | b |
| 33 | 16 | b | a | b |
| 34 | 17 | a | a | b |
| 35 | 19 | a | b | b |

(Note)

(Plating pre-treatment conditions)

Condition A: After immersion in an aqueous 50% solution of "L 5B" produced by Macdamid Co. at 40° C. for 3 minutes, washed with water, immersed in an aqueous 15% ammonium persulfate solution for one minute, washed with water, further immersed in 20% dil. sulfuric acid for 2 minutes and washed with water.

Condition B: After electrolytic defatting in an aqueous 5% solution of "Okite 90" produced by Diafloc Co. at a current density of 4A/dm$^2$ at 50° C. for 2 minutes, washed with water, inmersed in an aqueous 15% ammonium persulfate solution for one minute, further in 20% dil. sulfuric acid for 2 minutes and washed with water.

(Plating conditions)

Condition C: Plating is performed in a plating solution of "Copper sulfate conc." produced by Japan Metal Finishing Co. diluted with 19% sulfuric acid to 3.6-fold at a current density of 2.5 A/dm$^2$ at room temperature for 30 minutes.

Condition D: Plating is performed is an aqueous 50% solution of "Pyrodone conc." produced by Harshaw-Murata Co. at a current density of 2.5 A/dm$^2$ at 50° C. for 30 minutes.

Condition E: With the use of the solder plating solution (tin/lead = 4/6) produced by Macdamed Co., plating is performed at a current density of 2 A/dm$^2$ for 10 minutes.

(Tape peeling test evaluation)

a: Resist did not peel off at all.
b: On both sides of image line, some portions with width of 100 μm or less and length of 1 mm or less were peeled off.

COMPARATIVE EXAMPLE 2

Using the laminate prepared in Comparative Example 1, plating resistance test was conducted according to the same method as in Example 18. The plating conditions and the results of tape peeling test are shown below.

| Plating condition | Results of tape peeling test |
| --- | --- |
| A-C-E | Resist peeled off with width of 100 μm–200 μm and length of 3–5 mm on both sides of image line |
| B-C-E | Resist peeled off with width of 150 μm–250 μm and length of 4–10 mm on both sides of image line |
| A-D-E | Resist peeled off with width of 50 μm–150 μm and length of 3–5 mm on both sides of image line |

What we claim is:

1. In the formation of a resist image by exposing selected areas of a laminate including a photopolymerizable layer to actinic light, dissolving away the areas which were not exposed to the light and leaving the areas exposed to the light, the dissolution being effected with an organic solvent, the improvement which comprises employing as the laminate a photopolymerizable laminate consisting essentially of a photopolymerizable layer and a support layer, said photopolymerizable layer containing:

(1) 5 to 95% by weight, based on the total weight of the photopolymerizable layer, of a binder comprising a vinyl polymer or a vinyl copolymer, (2) 95 to 5% by weight, based on the total weight of the photopolymerizable layer, of a monomeric component containing at least 50% by weight of at least one compound selected from the group consisting of the photopolymerizable unsaturated compounds represented by the formula (A) shown below and having a value of molecular weight/number of double bonds contained of 1000 or less,

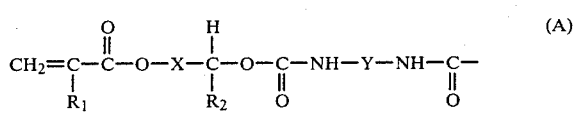

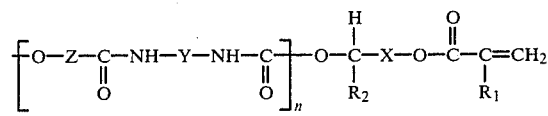

wherein
n is an interger of 0 or more;
R$_1$ is hydrogen or methyl;
X is a divalent C$_{1-8}$ aliphatic hydrocarbon group,

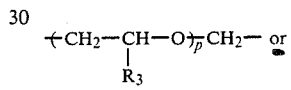

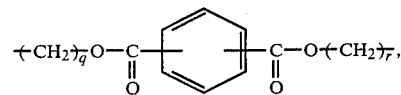

(where R$_3$ is a C$_{1-4}$ alkyl group, p is an integer of 1 to 10, q and r are each an integer of 1 to 4);
R$_2$ is a C$_{1-6}$ alkyl group or CH$_2$—O—R$_4$ (where R$_4$ is phenyl, an aryl group or a C$_{1-6}$ alkyl group);
Y is a hexamethylene group;
Z is

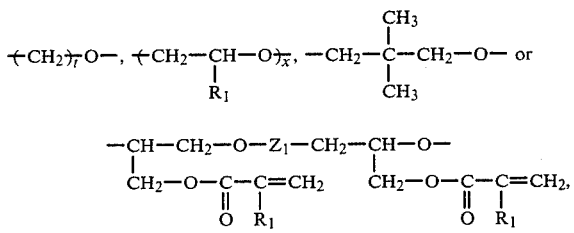

(where t is an integer of 2 to 10, x is an integer of 1 to 30, Z$_1$ is

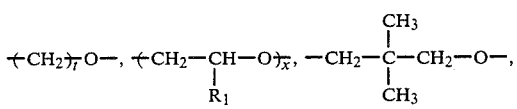

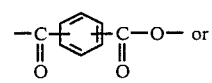

-continued
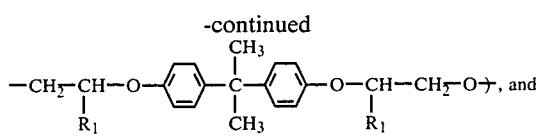
(3) 0.01 to 30% by weight, based on the total weight of the photopolymerizable layer, of a photopolymerization initiator.
2. A process according to claim 1, wherein the organic solvent is 1,1,1-trichloroethane.
3. A process according to claim 1, wherein (2) is the sole monomeric component.
* * * * *

UNITED STATES PATENT AND TRADEMARK OFFICE
CERTIFICATE OF CORRECTION

PATENT NO. : 4,702,997

DATED : October 27, 1987

INVENTOR(S) : Hideo Ai, et al.

It is certified that error appears in the above-identified patent and that said Letters Patent is hereby corrected as shown below:

| | |
|---|---|
| Col. 6, line 46 | After "developing" delete "timee" and substitute --time-- |
| Col. 18, last line of Table 1 | Under "solvent 2" delete "MEK 120" and substitute --MEK 100-- |
| Col. 18, line 18 | Delete "of" and substitute --on-- |
| Col. 24, line 26 | Correct spelling of --integer-- |

Signed and Sealed this

Seventeenth Day of May, 1988

Attest:

DONALD J. QUIGG

*Attesting Officer*  *Commissioner of Patents and Trademarks*